United States Patent
Day et al.

(10) Patent No.: US 8,027,094 B2
(45) Date of Patent: *Sep. 27, 2011

(54) LENSES, OPTICAL SOURCES, AND THEIR COUPLINGS

(75) Inventors: Timothy Day, Poway, CA (US); David F. Arnone, Mountain View, CA (US)

(73) Assignee: Daylight Solutions, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/878,829

(22) Filed: Sep. 9, 2010

(65) Prior Publication Data

US 2011/0006229 A1 Jan. 13, 2011

Related U.S. Application Data

(63) Continuation of application No. 12/425,306, filed on Apr. 16, 2009, now Pat. No. 7,796,341, which is a continuation of application No. 11/525,384, filed on Sep. 22, 2006, now Pat. No. 7,535,656, and a continuation-in-part of application No. 11/154,264, filed on Jun. 15, 2005, now Pat. No. 7,492,806.

(51) Int. Cl.
*G02B 27/30* (2006.01)
*G02B 13/18* (2006.01)

(52) U.S. Cl. .......... 359/641; 359/718; 359/719; 372/20; 372/38.02

(58) Field of Classification Search .......... 359/356, 359/641, 708, 718, 719, 872; 372/20, 22, 372/36, 38.02, 38.03, 39, 43.01, 101, 107; 250/504 R See application file for complete search history.

(56) References Cited

U.S. PATENT DOCUMENTS

| 2,684,015 A | 7/1954 | Grey |
| 4,470,662 A | 9/1984 | Mumzhiu |
| 4,555,627 A | 11/1985 | McRae, Jr. |
| 4,656,641 A | 4/1987 | Scifres et al. |
| 4,737,028 A | 4/1988 | Smith |

(Continued)

FOREIGN PATENT DOCUMENTS

DE 10205310 A1 9/2003

(Continued)

OTHER PUBLICATIONS

Newport Corporation Catalog pages, Infrared Lenses 2006 (provided in related case U.S. Appl. No. 11/525,384).

(Continued)

*Primary Examiner* — Loha Ben
(74) *Attorney, Agent, or Firm* — Roeder & Broder LLP

(57) ABSTRACT

A lens may operate in the mid-IR spectral region and couple highly divergent beams into highly collimated beams. In combination with a light source having a characteristic output beam, the lens may provide highly stable, miniaturized mid-IR sources that deliver optical beams. An advanced mounting system may provide long term sturdy mechanical coupling and alignment to reduce operator maintenance. In addition, devices may also support electrical and thermal subsystems that are delivered via these mounting systems. A mid-IR singlet lens having a numerical aperture greater than about 0.7 and a focal length less than 10 mm may be combined with a quantum well stack semiconductor based light source such that the emission facet of the semiconductor lies in the focus of the lens less than 2 mm away from the lens surface. Together, these systems may provide a package that is highly portable and robust, and easily integrated with external optical systems.

29 Claims, 5 Drawing Sheets

U.S. PATENT DOCUMENTS

| | | | |
|---|---|---|---|
| 4,745,276 A | 5/1988 | Broicher et al. |
| 4,772,789 A | 9/1988 | Maram et al. |
| 4,796,266 A | 1/1989 | Banwell et al. |
| 4,852,956 A | 8/1989 | Kramer |
| 4,871,916 A | 10/1989 | Scott |
| 5,005,934 A | 4/1991 | Curtiss |
| 5,050,176 A | 9/1991 | Naito et al. |
| 5,064,988 A | 11/1991 | E'nama et al. |
| 5,068,867 A | 11/1991 | Hasenberg et al. |
| 5,082,339 A | 1/1992 | Linnebach |
| 5,082,799 A | 1/1992 | Holmstrom et al. |
| 5,140,599 A | 8/1992 | Trutna, Jr. et al. |
| 5,161,408 A | 11/1992 | McRae et al. |
| 5,172,390 A | 12/1992 | Mooradian |
| 5,181,214 A | 1/1993 | Berger et al. |
| 5,225,679 A | 7/1993 | Clarke et al. |
| 5,255,073 A | 10/1993 | Wallin et al. |
| 5,264,368 A | 11/1993 | Clarke et al. |
| 5,315,436 A | 5/1994 | Lowenhar et al. |
| 5,331,651 A | 7/1994 | Becker et al. |
| 5,430,293 A | 7/1995 | Sato et al. |
| 5,457,709 A | 10/1995 | Capasso et al. |
| 5,491,714 A | 2/1996 | Kitamura |
| 5,523,569 A | 6/1996 | Hornfeld et al. |
| 5,537,432 A | 7/1996 | Mehuys et al. |
| 5,656,813 A | 8/1997 | Moore et al. |
| 5,662,819 A | 9/1997 | Kadomura |
| 5,751,830 A | 5/1998 | Hutchinson |
| 5,752,100 A | 5/1998 | Schrock |
| 5,780,724 A | 7/1998 | Olender et al. |
| 5,824,884 A | 10/1998 | Olender et al. |
| 5,834,632 A | 11/1998 | Olender et al. |
| 5,854,422 A | 12/1998 | McKeon et al. |
| 5,862,162 A | 1/1999 | Maeda |
| 5,866,073 A | 2/1999 | Sausa et al. |
| 6,089,076 A | 7/2000 | Mueller et al. |
| 6,134,257 A | 10/2000 | Capasso et al. |
| 6,154,307 A | 11/2000 | Veronesi et al. |
| 6,157,033 A | 12/2000 | Chudnovsky |
| 6,192,064 B1 | 2/2001 | Algots et al. |
| 6,243,404 B1 | 6/2001 | Joyce |
| 6,326,646 B1 | 12/2001 | Baillargeon |
| 6,327,896 B1 | 12/2001 | Veronesi et al. |
| 6,400,744 B1 | 6/2002 | Capasso et al. |
| 6,470,036 B1 | 10/2002 | Bailey et al. |
| 6,483,978 B1 | 11/2002 | Gao et al. |
| 6,553,045 B2 | 4/2003 | Kaspi |
| 6,575,641 B2 | 6/2003 | Yamabayashi et al. |
| 6,608,847 B2 | 8/2003 | Zhang et al. |
| 6,636,539 B2 | 10/2003 | Martinsen |
| 6,646,817 B2 | 11/2003 | Katsuma |
| 6,658,034 B2 | 12/2003 | Garnache et al. |
| 6,690,472 B2 | 2/2004 | Kulp et al. |
| 6,782,162 B2 | 8/2004 | Fukuzawa et al. |
| 6,803,577 B2 | 10/2004 | Edner et al. |
| 6,813,008 B2 | 11/2004 | Fein et al. |
| 6,856,717 B2 | 2/2005 | Kilian |
| 6,859,481 B2 | 2/2005 | Zheng |
| 6,866,089 B2 | 3/2005 | Avila |
| 6,885,965 B2 | 4/2005 | Butler et al. |
| 6,909,539 B2 | 6/2005 | Korniski et al. |
| 6,995,846 B2 | 2/2006 | Kalayeh et al. |
| 7,032,431 B2 | 4/2006 | Baum et al. |
| 7,061,022 B1 | 6/2006 | Pham et al. |
| 7,088,076 B2 | 8/2006 | Densham et al. |
| 7,151,787 B2 | 12/2006 | Kulp et al. |
| 7,189,970 B2 | 3/2007 | Racca et al. |
| 7,265,842 B2 | 9/2007 | Paldus et al. |
| 7,345,277 B2 | 3/2008 | Zhang |
| 7,358,498 B2 | 4/2008 | Geng et al. |
| 7,424,042 B2 | 9/2008 | Day et al. |
| 7,429,734 B1 | 9/2008 | Tidwell |
| 7,466,734 B1 | 12/2008 | Day et al. |
| 7,489,401 B2 | 2/2009 | Kamei et al. |
| 7,492,806 B2 | 2/2009 | Day et al. |
| 7,535,656 B2 | 5/2009 | Day et al. |
| 7,535,936 B2 | 5/2009 | Day et al. |
| 7,590,316 B2 | 9/2009 | Dames |
| 7,623,234 B2 | 11/2009 | Puzey |
| 7,732,767 B2 | 6/2010 | Houde-Walter |
| 7,733,925 B2 | 6/2010 | Pushkarsky et al. |
| 7,755,041 B2 | 7/2010 | Killinger et al. |
| 7,796,341 B2 | 9/2010 | Day et al. |
| 7,818,911 B2 | 10/2010 | Houde-Walter |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 2002/0024979 A1 | 2/2002 | Vilhelmsson et al. |
| 2002/0064198 A1 | 5/2002 | Koizumi |
| 2002/0090013 A1 | 7/2002 | Murry et al. |
| 2002/0105699 A1 | 8/2002 | Miracky et al. |
| 2002/0150133 A1 | 10/2002 | Aikiyo et al. |
| 2002/0176473 A1 | 11/2002 | Mooradian |
| 2003/0043877 A1 | 3/2003 | Kaspi |
| 2003/0063633 A1 | 4/2003 | Zhang et al. |
| 2003/0095346 A1 | 5/2003 | Nasu et al. |
| 2003/0123495 A1 | 7/2003 | Cox |
| 2003/0174315 A1 | 9/2003 | Byren et al. |
| 2003/0179789 A1 | 9/2003 | Pilgrim et al. |
| 2003/0179790 A1 | 9/2003 | Bouda et al. |
| 2003/0198274 A1 | 10/2003 | Lucchetti |
| 2004/0013154 A1 | 1/2004 | Zheng |
| 2004/0032891 A1 | 2/2004 | Ikeda et al. |
| 2004/0095579 A1 | 5/2004 | Bisson et al. |
| 2004/0165640 A1 | 8/2004 | Clifford et al. |
| 2004/0208602 A1 | 10/2004 | Plante |
| 2004/0228371 A1 | 11/2004 | Kolodzey et al. |
| 2004/0238811 A1 | 12/2004 | Nakamura et al. |
| 2004/0264523 A1 | 12/2004 | Posamentier |
| 2005/0083568 A1 | 4/2005 | Nakae et al. |
| 2005/0105566 A1 | 5/2005 | Sacher |
| 2005/0199869 A1 | 9/2005 | Shi |
| 2005/0213627 A1 | 9/2005 | Masselink et al. |
| 2005/0237524 A1 | 10/2005 | Kamei et al. |
| 2006/0056466 A1 | 3/2006 | Belenky et al. |
| 2006/0214107 A1 | 9/2006 | Mueller |
| 2006/0262316 A1 | 11/2006 | Baney |
| 2006/0268947 A1 | 11/2006 | Kalayeh |
| 2007/0019702 A1 | 1/2007 | Day et al. |
| 2007/0030865 A1 | 2/2007 | Day et al. |
| 2007/0047599 A1 | 3/2007 | Wysocki et al. |
| 2007/0291804 A1 | 12/2007 | Day et al. |
| 2008/0075133 A1 | 3/2008 | Day et al. |
| 2008/0231719 A1 | 9/2008 | Benson et al. |
| 2008/0298406 A1 | 12/2008 | Day et al. |
| 2008/0304524 A1 | 12/2008 | Marsland et al. |
| 2009/0015914 A1 | 1/2009 | Duncan et al. |
| 2009/0159798 A1 | 6/2009 | Weida et al. |
| 2009/0213882 A1 | 8/2009 | Weida et al. |
| 2009/0257709 A1 | 10/2009 | Dames |
| 2009/0262768 A1 | 10/2009 | Day et al. |
| 2010/0110198 A1 | 5/2010 | Larson et al. |
| 2010/0132581 A1 | 6/2010 | Day et al. |
| 2010/0229448 A1 | 9/2010 | Houde-Walter et al. |
| 2010/0243891 A1 | 9/2010 | Day et al. |
| 2011/0006229 A1 | 1/2011 | Day et al. |

FOREIGN PATENT DOCUMENTS

| | | |
|---|---|---|
| EP | 0877 454 A1 | 11/1998 |
| EP | 883 220 A2 | 12/1998 |
| EP | 2 081 265 A3 | 9/2009 |
| GB | 2286901 A | 8/1995 |
| JP | 55087107 A | 7/1980 |
| JP | 58072108 | 4/1983 |
| JP | 03-048480 A | 3/1991 |
| JP | 07-024322 B | 1/1995 |
| JP | 2005317819 A | 11/2005 |
| WO | WO9220127 A1 | 11/1992 |
| WO | WO 03/067720 A2 | 8/2003 |
| WO | WO2008036881 A2 | 3/2008 |
| WO | WO2008036884 A2 | 3/2008 |

OTHER PUBLICATIONS

Computar—Varifocal IR Lenses Feb. 2004 (provided in related case U.S. Appl. No. 11/525,384).

Wysocki et al. Appl. Phys. B. 2005 "Widely tunable mode-hope free ECQL for high resolution spectroscopic applications" (provided in related case U.S. Appl. No. 11/525,384).

Hensley, Joel, Recent Updates in QCL based Sensing Applications, Sep. 2006, Physical Sciences, Inc. (provided in related case U.S. Appl. No. 11/525,384).

Haim Lotem, Mode-hop suppression of Littrow grating-tuned lasers: comment, 20 Month 1994, p. 1, vol. 33, No. 00, Applied Optics (provided in related case U.S. Appl. No. 12/425,306).

Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America (provided in related case U.S. Appl. No. 12/425,306).

M. De Labachelerie and G. Passedat, Mode-hop suppression of Littrow grating-tuned lasers, Jan. 20, 1993, pp. 269-272vol. 32, No. 3, Applied Optics, © 1993 Optical Society of America (provided in related case U.S. Appl. No. 12/425,306).

Corrie David Farmer, "Fab and Eval. of QCL's", Sep. 2000, Faculty of Engineering, University of Glasgow, Glasgow, UK (provided in related case U.S. Appl. No. 12/425,306).

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland (provided in related case U.S. Appl. No. 12/425,306).

Gaetano Scamarcio et al., Micro-probe characterization of QCLs correlation with optical performance, APL 78, 1177 & APL 78, 2095 (2001), APL 2002, APL 2004, University of Bari, Bari Italy (provided in related case U.S. Appl. No. 12/425,306).

J. Faist, THz and Mid-IR Quantum cascade lasers, QM in space, Chatillon, Mar. 31, Science 2002, University of Neuchatel, EU Projects ANSWER/TERANOVA; Agilent, Funding Swiss National Science Foundation (provided in related case U.S. Appl. No. 12/425,306).

J.M. Hensley et al., Demonstration of an External Cavity Terahertz Quantum Cascade Laser, Copyright 2005, Optical Society of America, Washington, DC 20036 (provided in related case U.S. Appl. No. 12/425,306).

L. Hildebrandt et al., Quantum cascade external cavity and DFB laser systems in the mid-infrared spectral range: devices and applications, 2004, Marburg Germany (provided in related case U.S. Appl. No. 12/425,306).

Richard Maulini et al., Broadly tunable external cavity quantum-cascade lasers, 2005, University of Neuchatel, Neuchatel Switzerland (provided in related case U.S. Appl. No. 12/425,306).

Tsekoun, A. et al; "Improved performance of QCL's through a scalable, manufacturable epitaxial-side-down mounting process"; Feb. 2006 (provided in related case U.S. Appl. No. 12/425,306).

Pushkarsky, M. et al.; "Sub-parts-per-billion level detection of NO2 using room temp. QCLs"; May 2006 (provided in related case U.S. Appl. No. 12/425,306).

Wirtz, D. et al.; "A tuneable heterodyne infrared spectrometer"; Physikalisches Institut; University of Koln; Koln Germany Spectrochimica 2002 (provided in related case U.S. Appl. No. 12/425,306).

Williams, B. et al.;"Terahertz QCLs and Electronics"; PhD-MIT 2003 (provided in related case U.S. Appl. No. 12/425,306).

Hildebrandt, L.et al.."Quantum cascade external cavity laser systems in the mid-infrared spectral range," 2004, Sacher Lasertechnik Group, Marburg, Germany (provided in related case U.S. Appl. No. 12/425,306).

International Search Report and Written Opinion for PCT/US2007/079140 (related to the present application), publication date Aug. 20, 2008, Daylight Solutions, Inc. (provided in related case U.S. Appl. No. 11/525,384).

Extended Search Report for European Application No. 07814956.4 (related to the present application), publication date Jun. 22, 2010, Daylight Solutions, Inc. (provided in related case U.S. Appl. No. 12/425,306).

G. Totschig et al.,Mid-infrared external-cavity quantum-cascade laser XP-001161786, Oct. 15, 2002, pp. 1788-1790, Optics Letters/vol. 27, No. 20, © 2002 Optical Society of America.

Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics.

D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004.

US 7,733,928, 06/2010, Marsland, Jr. et al. (withdrawn).

Weida et al., Utilizing broad gain bandwidth in quantum cascade devices, Nov. 2010, vol. 49 (11) Optical Engineering, 111120, 0091-3286/2010 © 2010 SPIE.

File:LED, 5mm, green (en).svg-Wikipedia, the free encyclopedia, Description English: A labeled drawing of a 5mm round (the "normal" type) LED. Apr. 6, 2009, 3 pages, http://en.wikipedia.org/wiki/File:LED,_5mm,_green(en).svg.

ISP Optics—IR lens singlets (from ZnSe CVD) catalog pp. 45, 45a, 45b, http://www.ISPOPTICS.com Copyright © 2009 ISP Optics Corp. All rights reserved.(provided in related case U.S. Appl. No. 11/525,384).

Sitori, Carlo et al.,"Mid-Infrared (8.5 μm) Semiconductor Lasers Operating at Room Temperature," IEEE Photonics Technology Letters, Mar. 1997, pp. 297-299, vol. 9, No. 3, XP000684396, ISN:1041-1135, © 1997 IEE.

W.Y. Oh et al, "115 kHz tuning repetition rate ultrahigh-speed wavelength-swept semiconductor laser", received Apr. 11, 2005, accepted Aug. 9, 2005, pp. 3159-3163, vol. 30, No. 23, Optics Letters, © 2005 Optical Society of America.

Weida et al.,"Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr....

G.P. Luo et al.,Grating-tuned external-cavity quantum-cascade semiconductor lasers, May 7, 2001, Applied Physics Letters, vol. 78, No. 19, © 2001 American Institute of Physics.

Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE.

Cassidy et al., Short-external-cavity module for ehanced single-mode tuning of InGaAsP and AIGaAs semiconductor diode lasers, Oct. 1991, No. 10, pp. 2385-2388, © 1991 American Institute of Physics.

M.G. Littman, H.J. Metcalf: "Spectrally narrow pulse dye laser without beam expander" Applied Optics, vol. 17, No. 14, Jul. 15, 1978, pp. 2224-2227, XP002528173 US.

Gaetano Scamarcio, Mid-IR and THz Quantum Cascade Lasers, 2005, Physics Dept., University of Bari, Bari Italy (provided in related case U.S. Appl. No. 12/425,306).

T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/Applied Optics.

Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004.

Transient FM Absorption Spectroscopy, Jun. 7, 2005, pp. 1 and 2, http://www.chem/tamu.edu/group/north/FM.html.

FM Spectoscopy With Tunable Diode Lasers, Application Note 7, pp. 1-10, New Focus Copyright 2001.

John Andrews and Paul Dalin,Frequency Modulation Spectroscopy, Dec. 2005, pp. 24-26, http://www.spectroscopyeurope.com.

R.F. Curl and F.K. Tittel,Tunable infrared laser spectroscopy, 1998, pp. 219-272, Annu. Rep. Prog-Chem. Sect. C, 2002.

Shawn Wehe et al., AIAA 2002-0824 Measurements of Trace Pollutants in Combustion Flows Using Room-Temperature, Mid-IR Quantum Cascade Lasers , S. Wehe, et al. (Physical Sciences, Inc.) C Gmachi and F Capasso (Bell Lab., Lucent Technologies), Jan. 2002, cover and pp. 1-7, 40th AIAA Aerospace Sciences Meeting and Exhibit 14,Jan. 17, 2002, Reno, NV.

W. Huang, RRA Syms, J. Stagg and A.A. Lohmann, Precision MEMS Flexure mount for a Littman tunable external cavity laser, Mar. 2004, pp. 67-75, IEE Prc-Sci Meas. Technol vol. 151, No. 2 Mar. 2004.

K. Namjou, S. Cai, E.A. Whitaker, J. Faist, C. Gmacahi, F. Capasso, D.L. Sivco and A.Y. Cho, Sensitive absorption spectroscopy with a room-temperature distributed-feedback quantum-cascade laser, 1998, pp. 219-221, 1998 Optical Society of America.

Gregory E. Hall and Simon W. North, Transient Laser Frequency Modulation Spectroscopy, 2000, pp. 243-274, Annu. Rev.Phys. Chem. 2000.51:243-74-Copyright 2000.

External-cavity quantum-cascade lasers, May 11, 2005, pp. 1-4, http://www.unine.ch/phys/meso/EC/EC.html.

Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India.

R.A. Syms, A. Lohmann, MOEMS Tuning Element for a Littrow External Cavity Laser, Dec. 2003, pp. 921-928, Journal of Microelectromechanical Systems, vol. 12, No. 6 Dec. 2003.

A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America.

Cooke, M., Producing more light than heat from quantum cascade lasers, published on-line Jan. 10, 2010, www.semiconductor-today.com, Semiconductor Today, vol. 5, Issue 1, pp. 106-107, Feb. 2010.

Martini, Ranier et al., "High duty cycle operation of quantum cascade lasers based on graded superlattice active regions," Journal of Applied Physics, Jun. 15, 2001, pp. 7735-7738, vol. 89, No. 12, XP012052642 ISSN:0021-8979, © 2001 American Institute of Physics.

Victor Rudometov and Eugene Rudometrov, Peltier Coolers, May 11, 2005, pp. 1-11, http://www.digit-life.com /article/peltiercoolers.com/ © Digit-Life.com 1997-2004.

LENSES, OPTICAL SOURCES, AND THEIR COUPLINGS

CROSS-REFERENCE TO RELATED APPLICATIONS

This application is a continuation of U.S. application Ser. No. 12/425,306 filed on Apr. 16, 2009 entitled "Lenses, Optical Sources and Their Couplings", now U.S. Pat. No. 7,796,341 B2, which is a continuation of U.S. application Ser. No. 11/525,384 filed Sep. 22, 2006 now issued on May 19, 2009 under U.S. Pat. No. 7,535,656B2, and entitled "Lenses, Optical Sources, and Their Couplings" and a continuation in part of U.S. application Ser. No. 11/154,264, filed Jun. 15, 2005 entitled "Compact mid-IR Laser" which is now issued on Feb. 17, 2009 under U.S. Pat. No. 7,492,806B2. As far as is permitted, the contents of U.S. application Ser. No. 12/425,306; U.S. application Ser. No. 11/525,384 and U.S. application Ser. No. 11/154,264 are incorporated herein by reference.

BACKGROUND

1. Field

This disclosure is generally concerned with optical sciences and specifically concerned with mid-IR lenses having high numerical apertures and simultaneously short focal lengths, and further with coupling of such lenses to specialized optical sources.

2. Related Technology

Lasers are optical sources which provide light of remarkable characteristics. Coherence, high intensity, narrow bandwidth, among others are characteristics common to some lasers which permit their use in conjunction with complex systems to achieve remarkable results. Of particular interest is the highly collimated narrow beam produced by some lasers. Gas lasers have optical resonators defined by two minors arranged to produce very narrow beams of planar wavefronts (high spatial coherence). The optical output from such arrangements is highly useful in a great many systems partly because of the nature of the output beam.

In contrast to gas lasers, laser diodes are optical sources which convert electrical current to photonic output at a semiconductor PN junction which operates as a laser gain medium. As the geometry associated with such PN junction is generally planar, diodes arranged as lasers sometimes have an asymmetric stripe cross section resulting in output beams having a different degree of divergence in two orthogonal directions. Laser diodes have been used in conjunction with complex optics to condition an output beam to improve its symmetry.

In many optical systems, it is desirable to have an axially symmetric collimated beam of planar wavefronts. Yet it can be difficult to arrive at such output from some lasers; especially where a gain medium is constrained by certain geometric features. In those cases, a laser output beam may have less than ideal symmetry and beam shape. Whereas some gas laser systems have an output beam shape which depends on the resonator configuration, diode laser systems sometimes have an output beam conditioned by optics external to the resonator cavity. In some cases, special cooperation between a laser and its output optics can improve system performance.

Laser diode output beams have been coupled to external systems via micro optical elements. This is certainly true in the case where diode lasers are coupled to fiber optic systems. In such systems the micro optics used may be made from rather conventional materials since laser diode spectra, with very few exceptions, include only those wavelengths suitable for transmission by conventional optics. The art is crowded with semiconductor lasers coupled to external systems via micro optics elements.

Highly specialized structures recently being used as laser gain media include those known as quantum well stack or sometimes as "quantum cascade", QC or QCL, laser systems. These structures are semiconductor devices but are strictly not diodes. Rather, a unipolar structure of many layers provide for selective transitions between allowed energy states. When formed in accordance with prescribed designs and coupled with an appropriate optical resonator, a quantum well stack makes an excellent gain medium having good laser performance. In particular, quantum well gain media based laser devices may be arranged with exceptionally wideband gain profiles in the highly useful mid-IR spectrum. In some versions, these lasers are highly tunable and have exceptionally high power output.

However, as in the case with a diode laser beam produced in a quantum well gain medium device may have less than perfectly ideal shape and beam characteristics. The geometry of the gain medium sometimes imparts unwanted influence on the output beam shape. A quantum well stack gain medium is generally formed as a thin stripe semiconductor at the core of a waveguide. The waveguide supports resonant modes which help shape the overall output beam. In particular, a quantum well stack may include an emission facet from which an optical beam leaves the gain medium in a direction substantially normal to the facet surface. The long wavelength or "mid-IR" output beam from a quantum well based laser is typically highly divergent and can be somewhat asymmetric about orthogonal directions. Further, these devices have been constructed by experts in a fashion whereby a sufficiently wide waveguide will support a plurality of transverse oscillation modes. Transverse modes have a greater portion of optical energy 'off-axis'. This off-axis energy can be lost when a laser is coupled to inefficient systems which suffer aperture clipping effects.

Experts have now made many systems, instruments, experiments, based upon a quantum cascade lasers and in each and every case without exception, the output of the laser is handled in a fashion whereby the beam is conditioned for use and coupling with other subsystems and experiment or test components. Most generally, the output of a quantum cascade laser is coupled to an experiment by a collimation lens or a parabolic mirror. A quite common way to couple QCLs to external systems is via a mirror having a 50 millimeter focal length and a 50 millimeter clear aperture. While operable, this arrangement suffers from significant edge clipping and the loss is merely tolerated. Since these systems emit mid-IR wavelengths, special lenses which transmit these wavelengths are necessary. Materials such as zinc-selenide, germanium, chalcogonide, or other mid-IR transparent material are used to form these lenses.

As the infrared related optical sciences are well developed and quite mature, a great body of lens technologies exists in this area. Particularly, IR lenses configured for imaging tasks are plentiful. With only a cursory effort, an Internet search will generate hundreds of manufactures and designers for lenses useful in IR imaging systems. Imaging lenses are generally compound lenses made up of several individual pieces which function together to perform a high performance imaging relationship with an image plane. While an imaging lens can be used for laser collimation, this arrangement is certainly less than ideal.

In addition to IR imaging lens systems, lenses may be arranged for non-imaging or general purpose optical beam handling. Sometimes these lenses are available as "singlets"

or single element pieces. In one example of interest, laser collimation applications might call for a plano-convex lens operable at mid-IR wavelengths. Indeed, these lenses are widely available and may be purchased from suppliers of IR lenses. However, laser collimation singlets are designed for and are most suitable for laboratory use with optical beams having large cross-section; that is, laser collimation singlets are most generally large diameter devices of approximately 1 inch. These lenses designed for use in conjunction with special precision optical fixtures designed specifically to couple with low vibration optical benches and permit adjustable alignment and advanced stability features. These lenses typically have a clear aperture of at least 20 millimeters that may be designed with various focal lengths, but typically not with a focal length less than about 20 millimeters. The ratio of focal length to aperture is sometimes called "f#" or 'fnumber'. In rare cases, IR singlets having f-number as low as 1 can be found but it has been exceedingly difficult and complex to achieve f-numbers less than 1.

These are certainly not available on commercial markets. This is particularly true in the case of longer wavelengths of IR. While near IR systems enjoy the possibility of use of many lens materials, mid-IR systems are highly restrictive in this regard. Materials which transmit mid-IR wavelengths further complicate the possibility of manufacture of micro-optics having low f-number.

As many existing quantum cascade laser systems demand a collimated beam, a mid-IR singlet lens is placed in relation to the quantum cascade lasers such that the emission surface is at or near the focal point of the lens. Lenses which transmit mid-IR light are readily available having a focal length approximately 1 inch and an aperture or diameter of about 1 inch. This is the most commonly used optic for coupling a quantum cascade laser to related subsystems.

When a zinc selenide lens of diameter=1", and focal length=1" is used to collimate the output of a quantum cascade laser, the lens is placed with its focal plane at the emission aperture of the laser. Because the divergence of the laser output is greater than the numerical aperture of the lens, some light is lost at the lens extremities due to aperture clipping. While the amount of light lost may be as high as 30% of the laser output, this has been tolerated in published systems. This can be even more problematic for lasers which operate with transverse modes. In systems running with excited transverse modes, a greater percentage of optical energy is off-axis and lost at the lens aperture.

Accordingly, it is very desirable to provide for improved coupling between a mid-IR collimation lens and quantum well gain medium based lasers. First, it is desirable to improve matching of the numerical aperture such that the lens can receive the entire output of the laser. Second, it is highly desirable to reduce the laser energy which is off-axis and susceptible to losses at system apertures (high spatial frequency filtering/clipping). Lasers having a greater portion of energy on-axis can be more effectively coupled to lenses having a numerical aperture less than 1.

Due partly to materials limits, manufacturing processes available, and industrial experience in IR arts, it has been heretofore impossible to realize mid-IR singlets with numerical aperture greater than about 0.6. For most optical IR systems, this is not a problem as the physical nature of common IR systems does not demand lenses with such performance characteristics. Until the arrival of unipolar quantum well optical sources having characteristic highly divergent mid-IR output beams, and further the arrival of new applications in view of this particular source, there has been little or no effort to discover new devices characterized as high numerical aperture, short focal length, mid-IR lenses, and any such efforts have failed; and indeed left a great and unfulfilled need. This is clearly evidenced as skilled practitioners regularly choose inferior output couplings—i.e. those available.

Examples of infrared lenses available commercially include those described in the literature as follows:

Newport Corporation catalog pages including IR lenses describes AMTIR-1 low cost NIR to Mid-IR lenses arranged as singlets in 1" configurations. These lenses have a low NA or F/# no better than 1.

Computar Varifocal lenses have short focal lengths but these lenses are arranged as multi-element compound lens systems for IR imaging.

ISP optics catalog pages include ZnSe IR singlets characteristic of the state of the art for IR optics useful in the mid-IR spectrum. These optical elements are as small as 0.5 inch, however, in all cases their f/# is quite large and in no case are these lenses provided for short focal length applications. The lenses are all configured as 'thin' lenses having large working distances (and large focal lengths) which contribute to complex optical set-ups suitable for laboratory use only.

Wysokski et al present one of a great many systems representative in the art of a laboratory set-up on optical benches having large optical elements held in specialized optical mounting apparatus. A collimating lens is CL a 1" diameter f/0.6 lens. This is the typical way that a quantum cascade laser is coupled to an external optical experiment.

Another representative illustration of a quantum cascade laser coupled to an experimental set-up in the commonly used configuration is nicely described in the drawing of Hensley's paper: "Recent Updates in QCL-based Sensing Applications" from Physical Sciences, Inc. An optical bench is presented with stabile optical element holders and mounting systems which accommodate 1" optics common in the industry. The set-up requires a large optical table base for coupling all elements of the optical train which are separated by great distances exposing them to misalignment and vibration problems thereby requiring careful regulation of the apparatus in a guarded environment.

SUMMARY

Mid-IR, high numerical aperture lenses having short focal lengths, and couplings of such lenses with specialized unipolar quantum well based optical sources are disclosed. It is a primary function of these optical systems to provide temperature stable, miniature, mid-IR sources having a well collimated output beam of small cross section and high intensity. It is a contrast to prior art methods and devices that those systems do not account for collimated light in a compact system of high durability thus those systems are only suitable for laboratory use. Conversely, systems presented here may be integrated with highly portable or mobile ruggedized optical systems. A fundamental difference between optical arrangements of the instant systems and those of the art can be found when considering its compact, highly integrated nature and miniaturization of components as well as application of specialty components.

Embodiments include optical components arranged as mid-IR, high numerical aperture, short focal length lenses. In particular, lenses which have a high transmission for mid-IR spectra further having numerical apertures greater than about 0.7 and a focal length less than about 10 millimeters.

Embodiments further include systems comprising a mid-IR laser based upon quantum well gain media coupled with high numerical aperture, short focal length mid-IR lenses to produce high-quality output beams. A laser emission facet is aligned with and disposed at the focus of the lens such that the highly divergent laser output is well received by the lens clear aperture and efficiently coupled into a high quality output beam having a very narrow beam waist and high on-axis intensity. Thus, these embodiments include arrangements where a quantum well gain medium is placed in very close proximity to and on a common axis with a special mid-IR, high numerical aperture, short focal length lens.

In addition, embodiments include specially arranged lenses coupled to quantum well gain media via mounting systems having high thermal and vibrational stability. Mounting systems operate simultaneously to couple with precision a gain medium semiconductor chip with a specially arranged lens; in particular, to hold these two elements in relation to each other on a common optic axis. The mounting systems are highly stable in view of both vibrational disturbances and temperature fluctuations. In addition, these mounting systems are particularly arranged to accommodate the specific nature of these unique lenses as well as the specific nature of these optical sources. In particular, these mounting systems will accommodate lenses having an exceptionally short working distance. These mounting systems further account for the positional relationship between a quantum well stack emission facet with respect to the focal plane of the lens. These mounting systems also account for particular electrical drive needs associated with a quantum well based system. Finally, these mounting systems also account for coupling with active heat transfer systems.

Accordingly, there exists special relationships between quantum well optical sources and output coupler lenses described. These special relationships are not found in any of the systems of the arts; they are particular with respect to devices first presented here. A quantum well gain medium device emits mid-IR light in a highly divergent beam which is substantially received by a high numerical aperture, short focal length lens which outputs a thin collimated beam having a small cross section or beam waist of about between 3 and 8 millimeters. As such, the intensity of the collimated beam far exceeds any of those found in the art. The intensity is further improved in certain special versions having modified gain media specially configured to restrict or quench oscillation of transverse modes thereby increasing on-axis energy density and further improving coupling to these collimation lenses.

BRIEF DESCRIPTION OF THE DRAWING FIGURES

These and other features, aspects, and advantages of the present embodiments will become better understood with regard to the following description, appended claims and drawings where:

DETAILED DESCRIPTION

Figure 1:
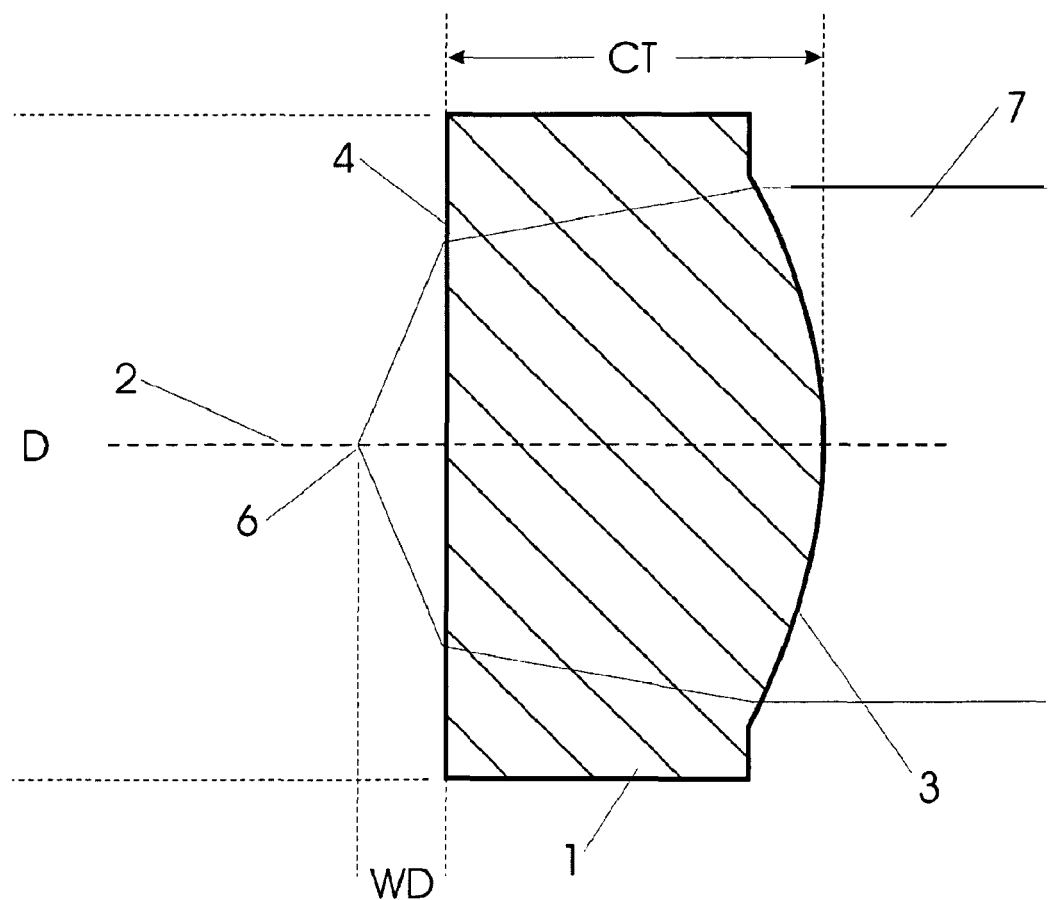
FIG. 1 is a cross sectional drawing of a lens element and ray trace example.

Throughout this disclosure, reference is made to some terms which may or may not be exactly defined in popular dictionaries as they are defined here. To provide a more precise disclosure, the following terms are presented with a view to clarity so that the true breadth and scope may be more readily appreciated. Although every attempt is made to be precise and thorough, it is a necessary condition that all possible meanings associated with each term can not be exhaustively set forth. Accordingly, terms are intended to also include their common meaning which may be derived from general usage within pertinent arts or by regular dictionary meaning. Where the presented definition is in conflict with a dictionary or arts definition, one must consider context of use and provide liberal discretion to arrive at an intended meaning. One will be well advised to error on the side of attaching broader meanings to terms used in order to fully appreciate the entire depth of the teaching and to understand all intended variations.

Quantum Well Stack. A quantum well stack is a semiconductor structure having a plurality of thin layers of highly regulated thickness. These thin layers define quantum well and barrier systems which support particular electron energy states and energy state transitions in accordance with a particular design. By careful selection of these energy state transitions, a quantum well stack may be fashioned and operate as the core of a laser gain medium. When a quantum well stack semiconductor is combined with a suitable optical resonator system and energizing or 'pumping' system, a device which supports stimulated emission or lasing action is achieved. For this paragraph, 'thin' means on the order of the de Broglie wavelength of an associated electron.

Unipolar Quantum Well Gain Medium. A unipolar quantum well gain medium is a system of elements including pump mechanism, waveguide system, unipolar quantum well stack, emission facets, and a base substrate, which operate together to provide optical amplification by stimulated emission. For purposes of this disclosure, a unipolar quantum well gain medium is distinct from a laser in that it does not include an optical resonator. Gain media described herein are always unipolar. That is, gain media are comprised of semiconductor materials of a declared semiconductor type either 'P' or 'N'. Thus, unipolar devices are certainly distinct from diodes which include both N-type and P-type and particularly a junction between. Conversely, unipolar systems are comprised of exclusively one semiconductor type.

High Numerical Aperture. High numerical aperture is herein defined to mean numerical apertures greater than about 0.7. While common optical systems typically include those having a numerical aperture less than 0.5; optical systems having a numerical aperture of 0.7 or greater are exceptional and considered as having a "high numerical aperture". While a numerical aperture of 1 has theoretical meaning, it remains quite difficult to realize in practical systems a numerical aperture greater than about 0.95. Thus, 'high numerical aperture' is best considered as those systems having a numerical aperture with any value between about. 7 and 0.95.

Short Focal Length. Short focal length refers to lenses and focusing mirrors which have a focal length less than about 8 millimeters. As there is no certain meaning associated with a lens having f=0, we declare a lower limit on our 'short focal length' to be about 0.5 millimeter. Any value between about 0.5 and 8 millimeters is herein considered a short focal length.

In accordance with preferred embodiments, lenses, optical sources and their couplings are provided. It will be appreciated that each of the embodiments described include an apparatus and that the apparatus of one preferred embodiment may be different than the apparatus of another embodiment. Accordingly, limitations presented in one example should not be carried forward and assumed to be an implied part of an alternative example.

As indicated in the summary, embodiments include optical components arranged as mid-IR, high numerical aperture, short focal length lenses. To accommodate transmission of mid-IR light, lenses of these embodiments are necessarily made from special glass or other material which transmits light at comparatively long wavelength. While previous IR systems have embraced unusual materials fashioned as optics for example salt windows, those materials are not desirable for use in making optical elements here. Instead, these systems are intended for use as durable components in compound systems, as such, it is preferred that they should be made from materials more sturdy than salts. Among the most useful materials having acceptable mid-IR transmission while additionally being quite durable in nature are crystalline zinc selenide, germanium, and a moldable glass material class known as "chalcogonides". Chalcogonides are particularly useful as molding is accompanied by attractive manufacturing benefits.

To accommodate optical beams which are highly divergent, these lenses are arranged in a fashion characterized as having a high numerical aperture; that is, they have a focal length which is relatively short compared to their clear aperture. Lenses of these embodiments have a numerical aperture greater than about 0.7.

These lenses also may be characterized as plano-convex lenses having two lensing surfaces one being a planar surface and one being convex. Lenses designed for use in converting between collimated light and a focused beam, and visa-versa, can be more efficient when arranged in a plano-convex configuration.

In addition, these lenses are distinct from their more common cousins, the 'thin lens' singlet in that they are relatively thick; that is, the two lensing surfaces are separated by a substantial distance. The lens equation for thick lenses takes into account the center thickness of the lens whereas for thin lenses this factor approaches zero and may be ignored. Lenses of these embodiments are typically a few millimeters thick.

For very high performance, the convex shape of the devices is not necessarily but preferably aspherical. With a well-chosen aspherical shape, these lenses may exhibit near diffraction limited performance and best mode systems anticipated include those having aspherical surfaces despite the manufacturing and engineering difficulties associated with arriving at such complex surface shapes. As aspherical surfaces are axially symmetric, these lenses include a linear optic axis.

As indicated, embodiments may also include combinations of quantum well gain medium optical sources with high numerical aperture, short focal length, lenses. Quantum well gain media sources include an emission facet or surface and implicitly an optic axis which is generally normal with respect to the emission facet. Due to structural geometries of quantum well gain medium systems, mid-IR optical beams emitted from the emission facet are emitted in a cone having a half angle sometimes greater than about 50°; and sometimes even greater than that. Thus, in order to couple the greatest amount of energy into a collimated beam, a lens having a numerical aperture of 0.7 or higher is combined with the quantum well gain medium optical source. A collimated beam is achieved when the emission facet is placed at the focus of the lens.

To provide for mechanical, electrical, optical, and thermal considerations, embodiments may also include coupling systems suitably arranged to accommodate two highly unique components and to accommodate them with a special relationship therebetween. A rigid mounting system provides receiving seats in which a lens and a quantum well gain medium semiconductor may be received and affixed. To support high-performance optical coupling, the mounting system alignment and stability functions with respect to the relative positions of the quantum well gain medium semiconductor and the lens. Sometimes these mounting systems additionally provide an adjustability lockout means to disable adjustment functionality and maintain a set relative position. Mounting systems of the embodiments may also include and support electronic energy delivery subsystems. These mounting systems by their design promote thermal stability and high vibrational resistance. Thermal stability is achieved because the component parts from which mounting systems are formed are made from materials having same or similar thermal expansion coefficients. As such, when the mounting system is subject to temperature change, it expands or contracts as a single unit and alignment is well preserved. In addition, the component parts are arranged to support very short distances between optical elements making the system highly tolerant of vibration. These quantum well gain media are excited by electrical currents which may be supplied to a quantum well stack via metallic conductors. Mounting systems presented include a provision to support routing of electrical leads proximate to these quantum well stack devices. In addition, electrical leads of these mounting systems may further include pads suitable for wire bond connections including those pads necessary for high current pulsed connections.

These mounting systems are further adapted and configured to receive and couple with thermal sinks including active devices such as a thermoelectric cooler, TEC. A base element of the mounting system is designed to expose a large surface area to which a heatsink may be attached. In some cases electronically driven active heat transfer systems may be attached to such surface. These mounting systems are formed of materials which promote heat transfer; i.e. they are comprised of materials which have high thermal conductivity.

More details may be appreciated in view of the following examples presented with reference to appended drawing figures. The following description with reference to FIG. 1, provides an excellent example which illustrates a particular lens element. A highly specialized lens 1 in an axially symmetric arrangement gives rise to optic axis 2. The lens comprises a curved surface 3 and a flat or planar surface 4. The curved surface in preferred high-performance versions is aspherical to provide maximum coupling of light in agreement with diffraction limits. One example of an aspherical surface which satisfies diffraction limited performance is described by the polynomial:

$$Z = \frac{Y^2}{R(1 + \sqrt{1 - (1+K)Y^2/R^2})} + A_4 Y^4 + A_6 Y^6 + A_8 Y^8$$

where R=2.2015; K=−0.8285; A4=−6.6119; A6=−2.7837; A8=2.6921, and X, Y and Z are spatial axes.

Of course it is easily recognized by experts that alternative polynomials may have similar or equal performance and the equation above is provided as an illustrative example of one preferred embodiment.

The lens 1 is arranged as a "thick" lens where its two lensing surfaces 3, 4 are appreciably separated by bulk lens material giving rise to a thickness on the lens axis 2 or 'center thickness' indicated in the drawing as CT. In some preferred versions, the center thickness is on the order of about 2 millimeters and in one best mode version of CT is equal to 2.083 millimeters.

It is a primary objective of these embodiments to operate in the mid-IR spectral region. Accordingly, lenses described here are made of special materials suitable for use with these wavelengths. A common material which may be used for mid-IR lenses in zinc selenide, or ZnSe. ZnSe is also suitable for use with configurations presented herein. ZnSe may be used to form an aspherical lens in a special "diamond turning" process. While excellent results have been obtained in this way, diamond turning can be expensive and sometimes results in imperfect devices. ZnSe material is also expensive and has some additional drawbacks. In certain cases materials other than ZnSe may be preferred. Materials sometimes and herein known as "chalcogenides" may also be used to form lenses suitable for use with mid-IR wavelengths. Chalcogenides are particularly useful because these materials may sometimes be molded. For lenses having complex surface shapes, for example some aspheric lenses, molding is a good option for inexpensive manufacture. One preferred type of material useful for forming these lenses is sometimes referred to by its brand name "AMTIR-1".

It is of particular importance that these lenses support integration with systems having greatly reduced size in view of conventional implementations. As most optical systems suffer alignment problems which are exacerbated by long lever arms generally found in an optical train, it is a major distinction that these systems aim to eliminate such alignment difficulties by obviating certain levers between optical elements. A first manner in which alignment problems may be reduced is to greatly reduce the spatial separation between critical elements in the optical train. To effect this, these mid-IR lenses are made on a scale not seen previously in the art. Small lenses are very difficult to produce and common lens manufacturing processes are better suited for large devices. However, advantages to system stability and ruggedness are quite attractive for systems including micro optical elements. Practitioners of the art and experts in QCL technologies did not explore the possibility of miniature mid-IR lens manufacture as suitable solutions to stability problems are readily available in laboratory environments. To this date, mid-IR systems based on quantum well lasers are not used outside of laboratory systems and environments. In the laboratories where QCLs are used, lens mounts, positioning, and adjustment systems of sufficiently high quality are coupled with very rigid optical tables. As such, there is no motivation to accept the challenges of miniature lens manufacture. The literature is replete with suggestion that suitable lenses are one-inch in diameter and have a numerical aperture no more than about 0.5.

In contrast, systems disclosed here may employ a singlet type plano-convex mid-IR lenses of a diameter 'D' not more than 10 mm, but preferably about 4 mm. A suitable clear aperture for such lenses may be less than 4 mm or about between 3.8 and 3 mm. In one preferred version, a lens has an effective focal length of only 1.47 millimeters. From the lens planar surface, a focal plane lies only 0.63 mm away and this is noted as the working distance illustrated as WD in the drawing. While the term 'focal plane' is used, it is recognized by all experts in optics that the geometric construct which describes the focus of a lens is anything but planar. This is especially true for aspherics and micro-lenses which tend to have severe off-axis aberrations. As these devices are not intended for imaging, off-axis performance is not a concern and liberal use of the term 'focal plane' is to be understood.

A point source 6 on axis at precisely the working distance from the lens will produce a highly collimated beam 7 which exits from the lens' curved surface. The arrangements described will produce an exceptional lens having a numerical aperture greater than 0.8 for nominal wavelengths at around 9 μm.

Because the working distance is so small, it is possible to more rigidly couple a point source light emitter to the lens giving excellent pointing and alignment stability and vibrational resistance. Such arrangements completely eliminate the need for sophisticated optical fixtures such as precision micrometer adjusted mounts, and massive, thick, rigid optical benches.

Figure 2:
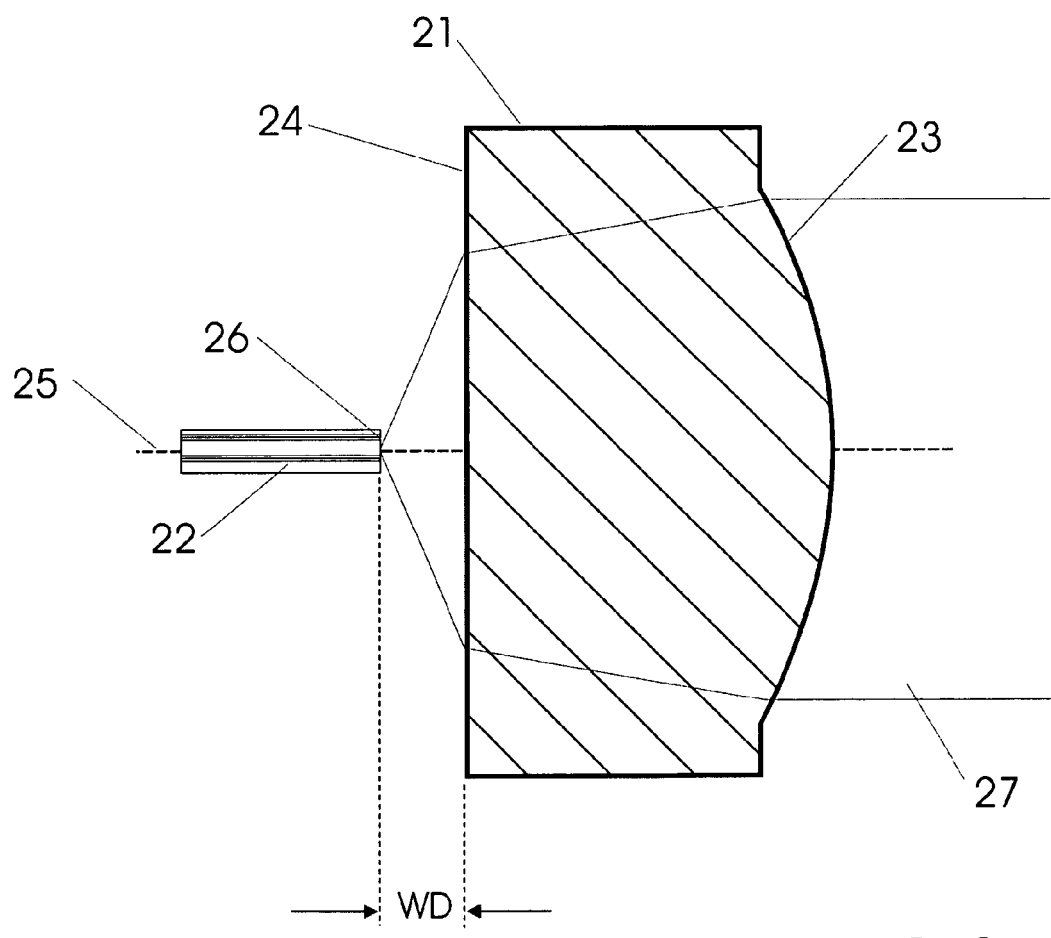
FIG. 2 illustrates a semiconductor light source coupled with a suitable lens in a cross sectional drawing.

Additional detailed description in this regard is presented with reference to FIG. 2. FIG. 2 illustrates a lens as described coupled to a unipolar quantum well gain medium light source with unique emission properties. In particular, beams having wavelengths in the mid-IR spectrum; i.e. those wavelengths between about 2 μm and about 20 μm. Thus lenses described are particularly suitable for coupling with quantum well stack based light sources with regard to wavelength. Quantum well stack light sources also produce output beams which are highly divergent. Due to the geometric construct of quantum well stack devices, a beam emitted therefrom subtends very large solid angles which may be expressed as a numerical aperture in a way similar but reciprocal to the same measurement associated with a lens. Accordingly, the nature of the output beams of quantum well stack light sources cooperates particularly well with the acceptance characteristics of lenses described here.

Unlike some other laser systems having complex emission facets or output couplers, the emission facets of quantum well stack light sources are physically suited for use in arrangements characterized as having limited working distance. The facet is flat and requires no supporting subsystems which might otherwise interfere with a lens surface placed nearby. Some laser systems having emission facets with high-voltage electrodes or front surface minor elements, might not be suited for coupling with these lenses having working distances less than 1 mm, however quantum well stack based lasers have an emission facet which can be placed in the focal plane and limited working distance of these lenses with relative ease. Thus it is the special attributes of a quantum well stack emitter which permits such unique coupling with a very small micro-lens design. All electrical connections and mechanical mounting connections may be made without interference at the device emission facet. This is an unusual relationship which will not be found in most laser type optical sources.

Accordingly, preferred embodiments include combinations of quantum well stack light sources and high numeric aperture, short focal length lenses. A miniature mid-IR thick lens 21 in plano-convex configuration forms an infinite conjugate ratio relationship with a quantum well stack based light emitter 22, for example a quantum cascade laser. The lens is comprised of aspherical surface 23 and flat surface 24. The lens and laser lie less than 1 millimeter apart on common optic axes 25 collinear with each other. The quantum well stack includes an emission facet 26 from which a highly divergent mid-IR optical beam may be emitted and received by the lens at its planar surface. The light beam passes through the lens surfaces and is refracted into a highly collimated output beam 27 having substantially planar wavefronts.

In best versions, it is highly desirable to provide special configurations of a quantum well gain medium. Since all lenses 'clip' the highest spatial frequency components of an optical beam, it becomes highly desirable to concentrate more optical energy on the axis. To achieve this, quantum well gain media and their associated waveguides can be configured such that they only support longitudinal modes. Resonator losses for the transverse modes are increased when the quantum well gain medium and waveguides are reduced in size whereby these modes cease to lase as these losses increase. Accordingly, some versions of these systems include a resonator which lases is only in longitudinal modes but not in transverse modes. In some example versions, a quantum well gain medium can be made to quench transverse modes when a quantum well gain medium is reduced to a width of about 25 microns. When a quantum well gain medium is only 25 microns wide, a greater portion of the laser energy appears on-axis and is more effectively coupled into the output beam.

Accordingly, embodiments may include highly specialized light sources characterized as quantum well stack based semiconductors coupled to miniature mid-IR lenses having high numeric aperture and short focal length; especially where the emission facet of the quantum well stack system lies in the focus of the lens.

Some embodiments may include a third important system which provides mechanical coupling between lenses and light sources described. Specially devised mounting, alignment, and coupling systems account for the exceptionally short focal lengths and very limited working distances of these highly unique lenses. Further, these mounting systems accommodate a relatively large aperture in further view of the limited working distance. In effect, these mounting systems are also associated with a high numerical aperture in that its physical dimensions are specifically chosen in a manner whereby these unusual sources maybe effectively coupled with these unusual lenses.

These mounting systems include fixed seats, one each for a lens and a quantum well stack based light source; and in some special cases a third useful subsystem relating to heat transfer. These mounting systems accommodate a lens of the nature described at a lens seat. A lens holder element has a geometric feature and shape which complements a similar cooperating geometric feature of the lens; for example a peripheral edge of prescribed size. When the lens is joined with this lens holder element of the mounting system, the lens position relative to holder element and implicitly the entire mounting system and all its components is indexed and assured by this seat. A lens may be fully seated in a lens holder via a solder or adhesive bond. In some preferred systems, the lens periphery is prepared with a solder before being inserted into a lens holder and thereafter the solder is melted to fuse the lens firmly to seat. Similarly, a seat is also provided whereby a semiconductor in the form of a quantum well gain medium having an axis is indexed and aligned with respect to mount and all its component parts when the semiconductor is affixed to said seat. The mount may include a third seat which is merely a surface and interface for coupling a thermoelectric cooler TEC or alternative heatsink.

The mounting systems of these embodiments may also account for another critical aspect as misalignment of optical systems due to uneven thermal expansion of any component parts tends to effect even well designed configurations. Mounting, alignment, and coupling systems presented here are arranged with a view to reduce alignment errors due to thermal expansion. In preferred versions where these mounting systems are made of several pieces, the pieces are made from materials having similar or same coefficients of thermal expansion. In this way, the component parts of a mount will expand and contract as if it were a single piece. In addition, where individual pieces couple with one another, their couplings and interfaces are selected from those types which are least affected by expansion due to temperature change. In preferred versions, these mounts include one threaded joint and one planar sliding interface joint which couples parts together for improved thermal performance.

A mount of these embodiments may be arranged from metal pieces having a sum total mass less than 20 grams. However in some versions it is useful to provide additional thermal mass and the mass may be as high as 200 g. This is readily achieved when a mount is formed from copper or copper alloys which are particularly useful for thermal conduction. Materials having a thermal conductivity greater than about 200 W/mk sufficiently carry heat in a manner suitable for these applications. Thermal conductivity of 500 W/mk or greater may be used for improved thermal conduction performance in advanced systems.

In preferred embodiments, mounts suitable for coupling a quantum well stack light source with a high numeric aperture, short focal length lens, may be arranged in three elements. Between two of these elements, a threaded coupling provides position adjustment along a single line or thread axis which is associated and collinear with an optical axis. Between two of the elements from which the mount is comprised, is a planar/planar sliding interface. Each of the elements of the sliding interface includes at least one carefully prepared planar surface which may be slid over the planar surface of the mating piece to promote positional adjustment in two orthogonal directions. In preferred systems, the two orthogonal directions associated with the planar/planar interface are also both orthogonal with respect to the adjustment direction defined by the threaded axis.

In some versions, the sliding interface position adjustment facility may be disabled. Mechanical means such as a set screw can be provided to lock the sliding interface into a desired position such that further sliding is prohibited and the relative position between the two elements is maintained.

Figure 3:
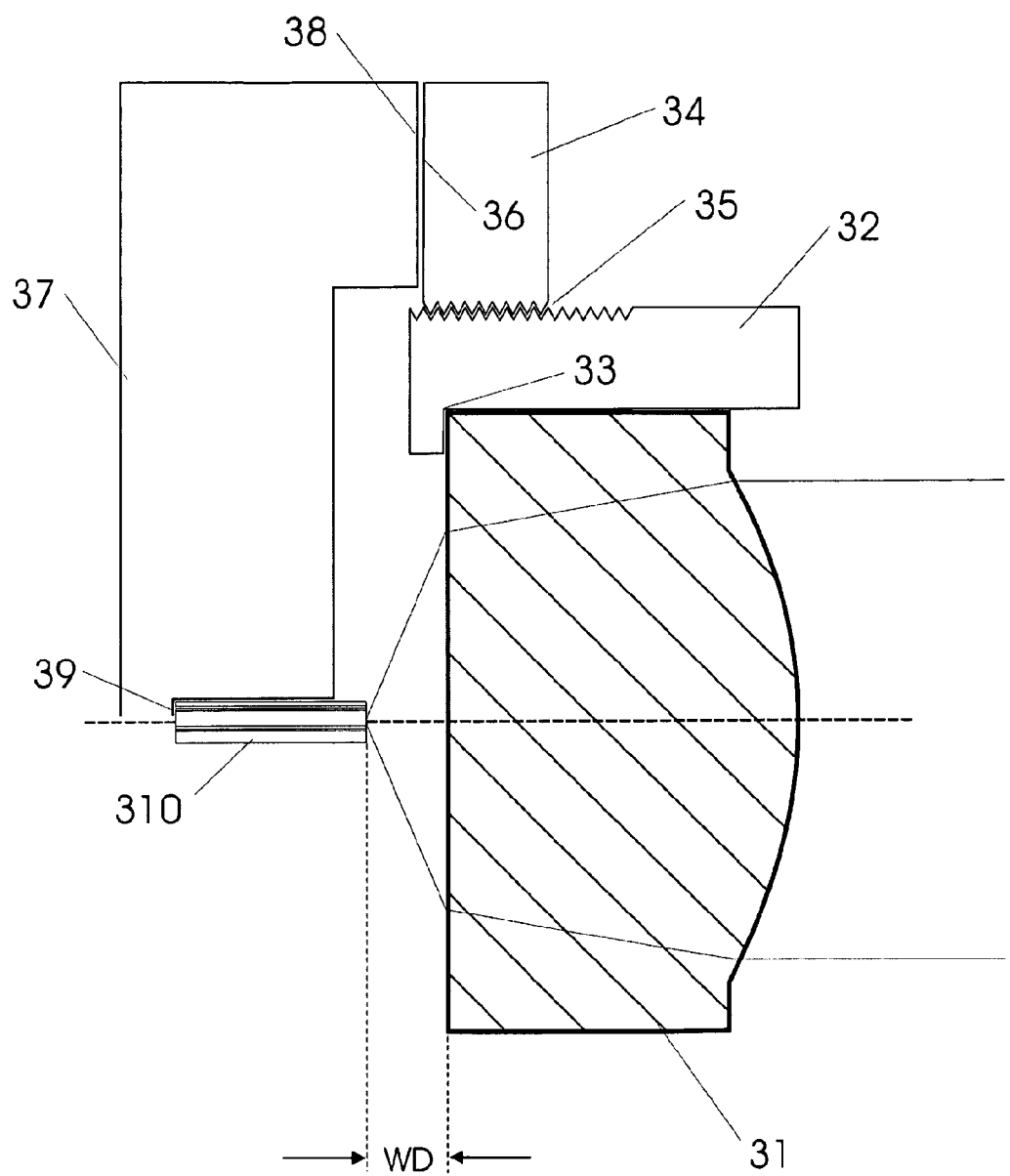
FIG. 3 shows a cross sectional drawing of an example lens, optical source, and mounting system therebetween.
Figure 4:
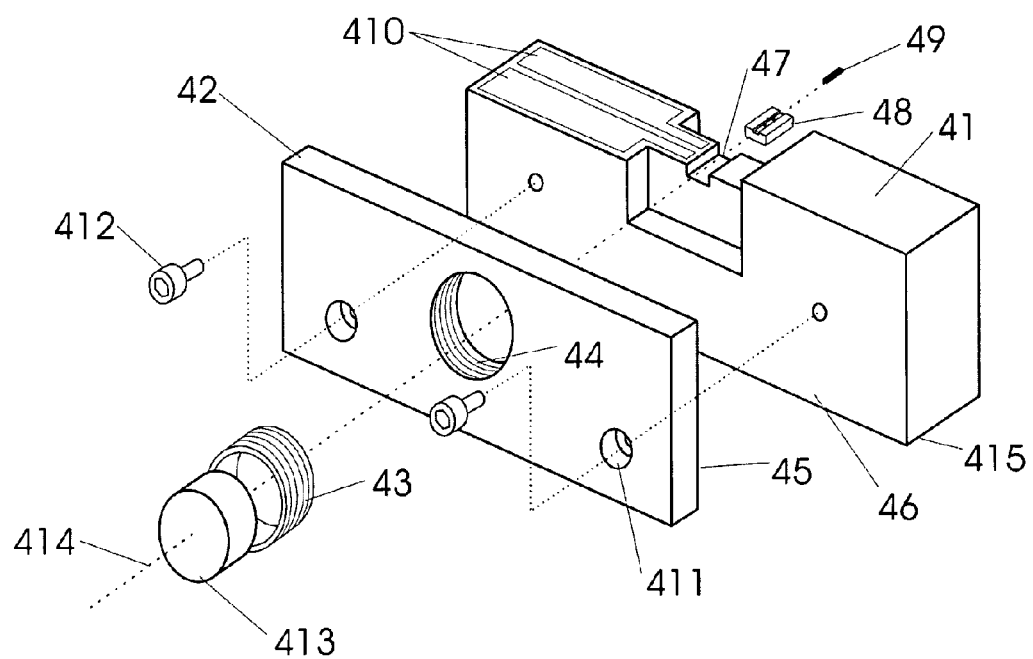
FIG. 4 is a perspective exploded view of one preferred embodiment.

Features of these mounting systems are more readily understood in view of the drawing FIGS. 3 and 4. Particularly, FIG. 3 presents a high numerical aperture, short focal length lens 31 having a working distance WD less than 1 mm. The drawing is arranged in cross section with symmetrical redundancy omitted for mounting system elements. Threaded barrel lens holder element 32 is provided with special lens seat 33 to effect an index between the lens and the mounting system. The lens holder elements have cylindrical symmetry and an opening and receiving cavity sufficient whereby a lens may be placed thereinto. Where a lens is inserted into a lens holder element and further placed against its seat, the position of the lens surface(s) relative to the holder is certain and a lens may be coupled to such lens holder elements via various means which may include epoxy, or adhesive or tight mechanical interlock such as a detent, among others. In all cases, the lens is securely affixed to the lens holder element.

A lens holder element couples to a lens plate element 34 via a threaded coupling 35. In some preferred versions, the threaded coupling may be formed about an exterior surface of the lens holder element. Threads are arranged with attention to the fact that the planar surface of the lens must arrive at a location less than 1 millimeter from the emission facet of the quantum well stack device. Further, the threads must be arranged to permit precision adjustment where a small rotational advance of the lens holder results in a smooth and precise subtle linear movement along the lens optic axis. To effect this, it is desirable to provide a threaded system with a comparatively high density of threads per linear measure, or thread pitch. Such high thread density also promotes angular stability in view of thermal expansion effects. A course and loose thread set is undesirable.

Lens plate element additionally includes a second coupling portion. The lens plate element includes a planar surface 36 which forms one half of these sliding planar interfaces. These mounting systems are whole when the third element, a base element 37 is brought into contact with the lens plate element by way of the sliding interface. The base element also has a carefully prepared highly smooth planar surface 38 which couples well with the similar surface on the lens plate element due to its size and shape. When brought together and in contact, the lens plate element and base element form the sliding joint interface which permits X-Y plane adjustments whereby the relative position of the lens axis and the quantum well gain medium axis may be made collinear. When alignment is preferred, the interface may be mechanically locked and remains highly stable despite the presence of any thermal or vibrational disturbances.

The base element also includes receiving structure into which a semiconductor element may be inserted and affixed. Chip seat 39 is preferably arranged as an inset space including mechanical index whereby a prescribed semiconductor element 310 when properly inserted benefits from an alignment and positioning bias. By way of such a seat, the tip having and a mission facet and implied optic axis is correctly aligned with the optic axis of the lens. Alternative versions include a base element with a seat designed to cooperate with receipt of a chip per-mounted on a substrate carrier. In this case, the base element seat receives the submount and provides good thermal coupling and alignment thereto.

Another detailed view of these mounting systems is included as FIG. 4 which illustrates a preferred version in an exploded perspective view. The mounting system is comprised of three primary elements including: a base element 41, a lens plate element 42, and a lens holder element 43. The lens holder element 43 has a partial cavity at its center portion into which a lens 413 may be inserted to position the lens 413 along an optical axis 414. It further has a threaded outer surface which supports high-density threads. Mating threads 44 are provided in a hole of the lens plate arranged perpendicular with respect to the sliding interface. Thus the lens holder and lens plate form a linearly adjustable coupling whereby the lens position relative to the base element may be adjusted with precision. The lens holder element 43 also supports a second coupling, a sliding plane interface which is orthogonal to the adjustment direction of the threaded coupling. A prepared planar surface 45, or lapped surface and complementary lapped surface 46 are placed into intimate contact with each other such that a sliding interface results. In this way, the lens 413 may be adjusted about in two orthogonal directions. Because the planar surfaces are prepared quite smooth, the interface support small movements in the plane for accurate alignment. The base element further includes support for a quantum well stack semiconductor, sometimes and preferably arranged as a laser. A mounting seat 47 may be provided to receive a submount device 48 having very high thermal conductivity. A semiconductor quantum well gain medium arranged as a laser 49 is put in good thermal contact with the submount such that heat generated at the laser easily passes to the submount and further into the base element.

In addition to mechanical, optical, and thermal support, the base element may also provide electrical support for lasers mounted therein. The base element may include electrical conductor leads 410 arranged as thin strip transmission lines on top surface of the base element. These conductors can supply electrical drive current to stimulate the laser and may be connected thereto via wire bonds.

An arrangement of oversized holes 411 and corresponding set bolts 412 operate together as a locking system. When the lens plate element is precisely located with respect to the laser emission facet, that is, when the optic axis of both the laser and the lens coincide, the lens plate is made fast with the set bolts which are threaded into the base element at the front surface. Oversized holes permit small X-Y movements as long as the bolts have not been securely tightened.

Figure 5:
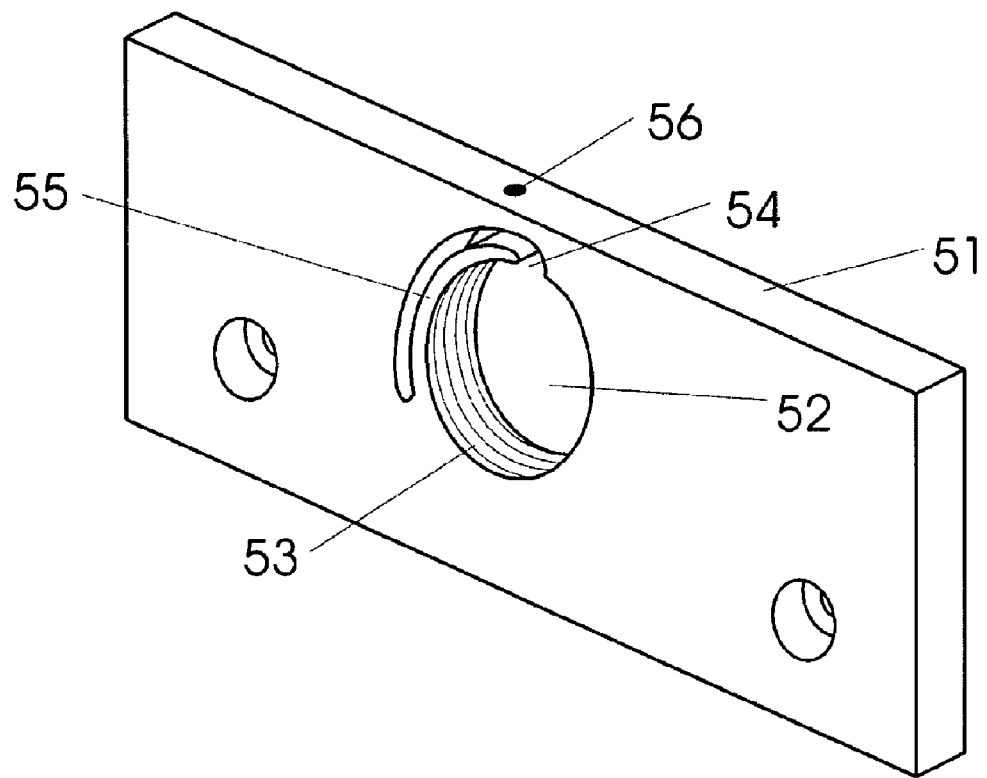
FIG. 5 is a special preferred alternative version of a lens plate element.

Some versions of these lens plate elements additionally account for a similar locking system for 'Z' direction adjustments. The threaded system may be provided with a compression lockout. FIG. 5 illustrates a special version of a lens plate 51 having such lockout system. The hole 52 prepared to receive a lens holder threaded cylinder therein includes complimentary threads 53. A special curved slot 54 is also cut into the lens plate. This curved slot forms flexure element 55. When a lens holder is properly coupled to the lens plate, the flexure element operates to squeeze the lens holder and hold it such that no further movement of the threads is possible due to high friction. A set screw can be driven into the hole 56 whereby the flexure element compresses onto a lens holder thus disabling action on the threaded coupling.

The examples above are directed to specific embodiments which illustrate preferred versions of devices and methods. In the interests of completeness, a more general description of devices and the elements of which they are comprised as well as methods and the steps of which they are comprised is presented herefollowing.

In most generic terms, embodiments preferably include: high numerical aperture, short focal length, mid-IR lenses. Especially those lenses formed as a single element thick lens having a numerical aperture greater than about 0.7 and up to about 0.95, and focal length less than about 8 millimeters. These lenses may further be distinguished as having a working distance less than about 2 millimeters, a diameter less than about 10 millimeters, and clear aperture less than about 8 millimeters. Additionally, they are plano-convex aspheric lenses.

Embodiments may also include a unipolar quantum well gain medium having an emission facet coupled to a lens focus, the lens having a focal length less than about 15 millimeters and a numerical aperture greater than about 0.7. Also where the lens is on the optic axis less than 2 millimeters from the emission facet. This includes a lens characterized as a plano-convex lens arranged in an infinite conjugate ratio configuration.

Embodiments may also include optical sources of quantum well gain media affixed to a compound mount and a lens similarly affixed, the gain medium having an emission facet at the lens focus, the mount rigidly coupling the quantum well gain medium and the lens in a fixed positional relationship. Additionally, where these mounts hold the lens less than 2 millimeters from the gain medium emission surface. Embodiments may include such mounts having a mass less than about 100 grams and thermal conductivity greater than about 200 W/mK.

Embodiments may also include mounts having a lens holder element, a lens plate element; and a base element. The lens holder element and lens plate element coupled by a linearly adjustable coupling, and the lens plate element and base element forming a planar sliding interface. In some versions, the lens holder is a cylindrical element having lens receiving cavity and a seat which provides a lens position index. A most useful mount includes two members each having a planar surface to effect a planar sliding interface providing position adjustment in two orthogonal directions. Some of these mounts include those made from parts having a similar coefficient of expansion. In addition, mounts may include couplings having mechanical lockout means or a set mechanism which immobilizes adjustability.

One will now fully appreciate how high numerical aperture, short focal length, mid-IR lens may be coupled with highly divergent gain media, and in particular via special mounting systems providing distinct advantage including improved output beam quality. Although the present embodiments have been described in considerable detail with clear and concise language and with reference to certain preferred versions thereof including best modes presently known to the inventors, other versions are possible. Therefore, the spirit and scope of the invention should not be limited by the description of the preferred versions contained therein, but rather by the claims appended hereto.

What is claimed is:

1. A mid-IR collimating lens having a numerical aperture of greater than 0.7 and a focal length of less than 8 millimeters.

2. The lens of claim 1, wherein the lens is a single element thick lens.

3. The lens of claim 1 having a numerical aperture of greater than 0.8.

4. The lens of claim 1 having a numerical aperture of greater than 0.9.

5. The lens of claim 1 having a working distance less than 2 millimeters.

6. The lens of claim 1 having a diameter less than 10 millimeters.

7. The lens of claim 1 having a diameter of about 4 millimeters.

8. The lens of claim 1 having a clear aperture less than 8 millimeters.

9. The lens of claim 1 having a clear aperture less than about 4 millimeters.

10. The lens of claim 1 having a working distance less than 2 millimeters, a diameter less than 10 millimeters, and a clear aperture less than 8 millimeters.

11. The lens of claim 1 having a working distance less than 2 millimeters, a diameter of about 4 millimeters, and a clear aperture less than about 4 millimeters.

12. The lens of claim 1 having a planar lensing surface and a curved lensing surface.

13. An optical source comprising a gain medium and the lens of claim 1, wherein the gain medium comprises at least one emission facet having an optic axis, and wherein the lens has a symmetry axis coincident with the emission facet optic axis.

14. An optical source comprising: (i) a mid-IR gain medium having an emission facet having an optic axis, and (ii) a mid-IR collimating lens that collimates light, the lens has a focal length of less than about 2 millimeters and a symmetry axis coincident with the emission facet optic axis.

15. The optical source of claim 14, wherein the lens has a numerical aperture greater than 0.7.

16. The optical source of claim 14, wherein the lens has a numerical aperture greater than 0.8.

17. The optical source of claim 14, wherein the lens has a working distance less than 2 millimeters.

18. The optical source of claim 14, wherein the lens has a diameter less than 10 millimeters.

19. The optical source of claim 14, wherein the lens has a clear aperture less than about 8 millimeters.

20. The optical source of claim 14, wherein the lens has a planar lensing surface and a curved lensing surface.

21. The optical source of claim 14, wherein the lens is disposed on the optic axis such that the gain medium emission facet is less than 2 millimeters from a surface of the lens.

22. The optical source of claim 14, wherein the lens is characterized as a plano-convex lens arranged in an infinite conjugate ratio configuration such that a planar side of the lens is towards the emission facet of the gain medium.

23. The optical source of claim 14, wherein said lens is a single element, plano-convex, thick lens having a working distance less than 2 millimeters and numerical aperture greater than 0.7, and wherein said convex surface is aspherical.

24. A method for generating mid-IR light, the method comprising the steps of: (i) emitting mid-IR light along an optic axis, and (ii) a collimating the mid-IR light with a mid-IR collimating lens, the lens having a numerical aperture of greater than 0.7, a focal length of less than 2 millimeters and a symmetry axis coincident with the emission facet optic axis.

25. The method of claim 24, wherein the step of collimating includes the lens being characterized as a plano-convex lens arranged in an infinite conjugate ratio configuration such that a planar side of the lens is towards the emission facet of the gain medium.

26. The method of claim 25, wherein the step of collimating includes the lens having a working distance less than 2 millimeters and a clear aperture less than 4 millimeters.

27. An optical source comprising: (i) means for generating mid-IR light along an optic axis, and (ii) means for collimating the mid-IR light, the means for collimating including a lens having a numerical aperture of greater than 0.7, a focal length of less than 2 millimeters and a symmetry axis coincident with the optic axis.

28. The optical source of claim 27, wherein the means for collimating includes the lens being plano-convex and arranged in an infinite conjugate ratio configuration such that a planar side of the lens is towards the means for generating the mid-IR light.

29. The optical source of claim 28, wherein the lens has a working distance less than 2 millimeters and a clear aperture less than 4 millimeters.

* * * * *